United States Patent [19]

Gordon et al.

[11] Patent Number: 4,695,332
[45] Date of Patent: Sep. 22, 1987

[54] METHOD OF MAKING A SEMICONDUCTOR LASER CRT

[75] Inventors: Eugene I. Gordon, Convent Station; Uri Levy, Berkeley Heights, both of N.J.

[73] Assignee: American Telephone and Telegraph Company, AT&T Bell Laboratories, Murray Hill, N.J.

[21] Appl. No.: 737,787

[22] Filed: May 28, 1985

Related U.S. Application Data

[62] Division of Ser. No. 453,577, Dec. 27, 1982, Pat. No. 4,539,687.

[51] Int. Cl.⁴ .................... H01L 21/20; H01L 21/36
[52] U.S. Cl. ............................ 437/126; 148/DIG. 95; 156/605; 156/610
[58] Field of Search ............... 156/624, 605, DIG. 80, 156/610; 148/171, DIG. 95; 29/576 E; 427/53.1, 87; 372/43, 74

[56] References Cited

U.S. PATENT DOCUMENTS

| | | | |
|---|---|---|---|
| 3,505,613 | 4/1970 | Campbell et al. | 372/43 |
| 3,558,956 | 1/1971 | Basov et al. | 313/421 |
| 3,575,250 | 7/1973 | Packard et al. | 331/94.5 |
| 3,715,162 | 2/1973 | Campbell et al. | 356/30 |
| 3,747,018 | 7/1973 | Tait et al. | 331/94.5 |
| 3,836,224 | 9/1974 | Strehlow et al. | 350/3.5 |
| 3,864,645 | 2/1975 | Packard et al. | 331/94.5 H |

OTHER PUBLICATIONS

Basov et al., "Negative Absorption Coefficient at Indirect Transitions in Semiconductors", *Advances in Quantum Electronics*, Columbia University Press, pp. 496–506 (1961).
D. A. Cusano, "Radiative Recombination from GaAs Directly Excited by Electron Beams", *Solid State Comm.*, vol. 2, pp. 353–358 (1964).
Hurwitz et al., "Electron-Beam-Pumped GaAs Laser", *Applied Physics Letters*, vol. 5, No. 7, pp. 139–141 (1964).
Basov et al., "Cadmium Sulfide Laser Excited by Fast Electrons", *Sov. Phys. JETP*, vol. 20, No. 4, pp. 1067–1068 (1965).
Kurbatov et al., "Generation of Coherent Radiation in Gallium Arsenide by Electron Excitation," *Sov. Phys.-Doklady*, vol. 10, No. 11, pp. 1059–1060 (1966).
Basov et al., "Gallium Arsenide Laser with Plane Resonator", *Sov. Phys.-Doklady*, vol. 11, No. 6, pp. 522–524 (1966).
Tait et al., "End-Pumped Laser Emission from Cadmium Sulfide Selenide Bombarded by an Electron Beam", *Journal of Applied Physics*, vol. 38, pp. 3035–3036 (1967).
Packard et al., "Standing Waves and Single-Mode Room-Temperature Laser Emission from Electron-Beam-Pumped Cadmium Sulfide", *IEE Journal of Quantum Electronics*, vol. QE-5, No. 1, pp. 44–47 (1969).
F. H. Nicoll, "Low Threshold Electron Beam Pumped CdS Lasers with End-Pumped Configuration", *Applied Physics Letters*, vol. 16, No. 12, pp. 501–503 (1970).
Nasibov et al., "Electron-beam Tube with a Laser Screen", *Sov. J. Quant. Electron.*, vol. 4, No. 3, pp. 296–300 (1974).
Koslovskii et al., "Formation of a Television Image with the Aid of a Laser Electron-Beam Tube under Line Scanning Conditions", *Sov. J. Quant. Electron.*, vol. 5, No. 7, pp. 865–866 (1975).
Akimov et al., "Tunable $Ga_xIn_{1-x}As_ySb_1$-Quaternary Semiconductor Laser", *Sov. J. Quant. Electron*, vol: 10, No. 3, pp. 368–369 (1980).

(List continued on next page.)

Primary Examiner—Gary P. Straub
Attorney, Agent, or Firm—Michael J. Urbano

[57] ABSTRACT

Room temperature laser action is achieved in a cathode ray tube (CRT) in which the target includes a plurality of semiconductor layers: a thin, wide bandgap buffer layer; a thicker, narrow bandgap active layer; and a much thicker wide bandgap cavity-length-adjusting layer. The light beam direction is essentially parallel to the e-beam direction and hence is scannable.

3 Claims, 5 Drawing Figures

OTHER PUBLICATIONS

Kozlovskii et al., "Electron-Beam-Pumped CW GaAs Laser", *Sov. Tech. Phys. Lett.*, vol. 6, No. 4, pp. 198–200 (1980).

Grigor'ev et al., "Possible Use of Quantoscopes-New Devices with Electron-Beam-Scanned Semiconductor Lasers-in Large-Screen Color Projection Television Systems", *Sov. J. Quant. Electron.*, vol. 10, No. 3, pp. 279–282 (1980).

Bogdankevich et al., "Multilayer GaAs-AlAs Heterostructure Laser Pumped Transversely by an Electron Beam, *Sov. J. Quant. Electron,* vol. 10, No. 6, pp. 693–695 (1980).

Bogdankevich et al., "Influence of Doping of $Ga_{0.68}Al_{0.32}As$ on its Cathodoluminescence and Threshold Current Density of a Laser Pumped by an Electron Beam," *Sov. J. Quant. Electron.,* vol. 11, No. 1, pp. 119–121 (1981).

METHOD OF MAKING A SEMICONDUCTOR LASER CRT

This application is a division of copending application Ser. No. 453,577, filed Dec. 27, 1982 (now U.S. Pat. No. 4,539,687, issued on Sept. 3, 1985).

BACKGROUND OF THE INVENTION

This invention relates to semiconductor lasers and, more particularly, to such lasers pumped by means of an electron beam. Electron beam (e-beam) pumped semiconductor lasers are generally of two types: transverse lasers in which the directions of the e-beam and light beam are orthogonal to one another, and longitudinal lasers in which the directions of the e-beam and light beam are essentially parallel to one another.

(a) Transverse Lasers—This method of pumping semiconductor crystals with a beam of fast electrons to obtain "optical maser" action in the visible and infrared regions of the spectrum was proposed two decades ago by N. G. Basov, *Advances in Quantum Electronics*, Columbia University Press, page 506, (1961). Experimental work followed soon after, and the first laser action in an e-beam pumped semiconductor was demonstrated by Basov et al, in 1964, *Soviet Physics JEP*, Vol. 20, No. 4, page 1067, (1965). These researchers used 200 keV electrons to bombard a CdS single crystal that was kept at liquid helium temperature. In the same year, C. E. Hurwitz et al, *Applied Physics Letters*, Vol. 5, No. 7, page 139, (1964) and D. A. Cusano, Solid State Communications, Vol. 2, No. 11, page 353, (1964) obtained lasing in e-beam pumped GaAs. Other workers achieved similar results in InSb, InAs, and GaSb.

In all of these laser demonstrations the crystals were cooled to liquid nitrogen temperature or lower. However, only a year later, in 1965, L. N. Kurbatov et al, *Soviet Physics—Doklady*, Vol. 10, page 1059, (1966), were able to achieve pulsed laser action in GaAs at room temperature.

In these early lasers, the cavity axis (and hence the light beam) was perpendicular to the pumping electron beam, and as a consequence they are referred to as "transverse lasers". Stimulated emission in transverse lasers is relatively easy to achieve compared to lasing in "longitudinal lasers" where the cavity axis (and hence the light beam) are essentially parallel to the electron beam. The reason for this difference is the shallow penetration of the e-beam into the semiconductor which limits the length of the active region in longitudinal lasers to several micrometers and leaves the remaining, unpumped material in a lossy state. Also, the short distance over which the gain is achieved in longitudinal lasers means that the net gain is relatively small.

Over the past fifteen years, a large variety of semiconductor crystals have been made to lase in the transverse configuration. The lasing wavelengths cover the range of 0.325 $\mu$m to 32 $\mu$m. Peak power outputs of over 100 watts and power conversion efficiencies of over 20% are not unusual.

Along with these demonstrations and related studies of luminescence properties, several physical effects and semiconductor parameters were investigated. For example, loss mechanisms, carrier migration, material degradation, depth of electron penetration, doping levels and threshold relations, effect of surface treatments on threshold, carrier lifetime versus carrier density, lasing wavelength versus cavity length and as a function of time, far field distributions, effects of scanning velocity, and means for directing the output beam parallel to the e-beam such as distributed feedback structures and V-shaped grooves. Also, the effect of GaAs/AlGaAs heterostructure configurations on lasing threshold were investigated by O. V. Bogdankevich et al, *Soviet Journal of Quantum Electronics*, Vol. 10, No. 6, page 693, (1980); and Vol 11, No. 1, page 119, (1981).

In addition, several types of sealed CRT tubes were fabricated and tested, e.g., Yu A. Akimov et al, *Soviet Journal of Quantum Electronics*, Vol. 10, No. 3, page 368, (1980). These include a demonstration of TV picture projection by (fast) e-beam scanning in one dimension and (slow) rotating-polygon light deflection in the second dimension by V. I. Kozlovskii et al, *Soviet Journal of Quantum Electronics*, Vol. 5, No. 7, page 865, (1975). Continuous wavelength tuning by scanning the e-beam across a composition-varying semiconductor crystal was also suggested and tested.

Longitudinal e-beam pumped lasers, although much more difficult to make than transverse lasers, are more attractive, especially from a practical point of view, as discussed below.

(b) Longitudinal Lasers—The first stimulated emission in the longitudinal configuration was observed by N. G. Basov, in 1966, *Soviet Physics—Doklady*, Vol. 11, No. 6, page 522, (1966). Basov et al, modified an accelerator to hit a 100 $\mu$m thick, polished slice of GaAs with a focused beam of 150 keV electrons. They observed stimulated emission at liquid nitrogen temperature and even at room temperature. At the end of the same year, W. C. Tait et al, *Journal of Applied Physics*, Vol. 38, page 3035, (1967) submitted a paper describing stimulated emission from 50 $\mu$m thick $CdS_{0.3}Se_{0.7}$ at liquid nitrogen temperature, using a 50 keV electron beam. Less than two years later, J. R. Packard et al, *IEEE Journal of Quantum Electronics*, Vol. QE-5, No. 1, page 44, (1969) observed room temperature stimulated emission from 7 $\mu$m thick CdS platelets at room temperature with 45 keV electrons. In 1970, F. H. Nicoll, *Applied Physics Letters*, Vol. 16, No. 12, page 501, (1970) obtained room temperature lasing in 5 $\mu$m thick CdS platelets pumped with electrons of only 25 keV energy. In some special cases, where a back aluminum layer was heat-treated to form a bubble, the threshold energy of the pumping electrons (for room temperature lasing) was as low as 9 keV.

In all of these demonstrations and most of the later experiments, the pumping electrons were made to have pulse durations of tens or hundreds of nanoseconds and a very low duty cycle. However, in 1980, V. I. Kozlovskii et al, *Soviet Technical Physics Letters*, Vol. 6, No. 4, page 198, (1980), were able to obtain CW lasing in a Te-doped GaAs plate which was about 40 $\mu$m thick. The semiconductor target was held at liquid nitrogen temperature and was pumped by 50–100 keV electrons. At one point, using 75 keV electrons with a beam current of 5 $\mu$A and a beam spot of a few um in diameter, they measured 12 mW of CW output power. Throughout the years, several sealed tubes were fabricated and tested, some of which operated hundreds or even thousands of hours. See, for example, V. I. Grigor'ev et al, *Soviet Journal of Quantum Electronics*, Vol 10, No. 3, page 279, (1980).

The efforts of some of these researchers have resulted in the grant of several U.S. Patents: N. G. Basov et al, U.S. Pat. No. 3,558,956 (1971); D. A. Campbell et al, U.S. Pat. No. 3,505,613 (1966); D. A. Campbell et al, U.S. Pat. No. 3,715,162 (1973); W. C. Tait et al, U.S. Pat. No. 3,747,018 (1973); J. R. Packard et al, U.S. Pat. No. 3,757,250 (1973); W. H. Strehlow et al, U.S. Pat. No. 3,836,224 (1974); and J. R. Packard et al, U.S. Pat. No. 3,864,645 (1975).

In all of the above-described e-beam pumped longitudinal lasers, the target was a single crystal, in most cases cut from the bulk and then polished on both sides to form a thin smooth wafer. This configuration, however, suffers from several disadvantages: it contains an optically lossy unpumped region, it lacks confinement of excess carriers, and it exhibits nonradiative surface recombination.

The prior art workers were aware of the problem of absorption losses in the unexcited portion of the active region. Tait et al and Packard et al attributed the success of their Group II–VI lasers to phonon-assisted transitions for which the absorption losses in the unexcited region are small. On the other hand, Basov et al in their U.S. Pat. No. 3,558,956 argue as follows: "Owing to the heating of the active region of the film at the depth of penetration of the electron beam, Coulomb interaction between nonequilibrium carriers and lattice polarization, or the interaction of nonequilibrium carriers with phonons, the wavelength of the induced emission is greater than the limit of intrinsic absorption. Therefore, the unexcited regions of the film are transparent to the generated emission and do not produce appreciable losses in the resonator, even though the depth of penetration of the electrons in the semiconductor may be less than the thickness of the film".

However, the gap between the actual threshold current densities reported in the literature and the expected current densities when absorption in the unexcited region is small, suggests that the combined contribution of all of the above-quoted effects is not sufficient for efficient operation. In other words, the threshold in most cases was unnecessarily high due (at least in part) to significant absorption losses in the unexcited part of the cavity. For example, a GaAs target excited by 40 keV electrons should reach threshold at room temperature at a current density of about 20 A/cm$^2$ when the following conditions are assumed: a carrier lifetime of 1 ns, 5 eV for the generation of one pair (~29% internal energy conversion efficiency), 5 $\mu$m penetration depth, and 15% overall losses. Under these conditions, the excess carrier density is $2 \times 10^{18}$ cm$^{-3}$, and the (calculated) gain coefficient is 320 cm$^{-1}$. In comparison, Kozlovskii et al, surpa, reported an e-beam CW GaAs laser with a threshold current density of about 25 A/cm$^2$ even though their sample was cooled to 80° K., the electron energy was 75 keV and the transmittance of the output mirror was 1%. Similarly, Packard et al, supra, pumped their room temperature CdS target with 1 mA of 45–50 keV electrons, focused to a spot of about 25 $\mu$m in diameter which corresponds to a current density of 220 A/cm$^2$.

In this context it should be noted that in semiconductors the wavelength at which maximum gain occurs is a function of excess carrier density and is shifted to the short-wavelength side as the carrier density increases. But, because of absorption in the unexcited part of the cavity, the laser is forced to operate at a wavelength region other than that where the maximum gain occurs. This fact is manifested, of course, in increased threshold and reduced efficiency.

With regard to the lack of carrier confinement in prior art longitudinal lasers, we note that the gain coefficient is a very steep function of (minority) carrier density. For example, in GaAs at room temperature the gain coeffiecint for $1 \times 10^{18}$ carriers/cm$^3$ is 10 cm$^{-1}$ whereas for $2 \times 10^{18}$ carriers/cm$^3$ the gain coefficient is 320 cm$^{-1}$. Thus, although the diffusion of carriers into the unpumped region increases the length of the active region in the cavity, it may also cause a significant reduction in the overall gain.

The third disadvantage of prior art longitudinal lasers relates to nonradiative recombination at the surface of the semiconductor, particularly at low acceleration voltages. See, for example, A.s. Nasibov et al, *Soviet Journal of Quantum Electronics*, Vol. 4, No. 3, page 296, (1974). This type of loss, which typically generates heat rather than light, causes a marked increase in threshold and may even prevent laser action completely.

SUMMARY OF THE INVENTION

An e-beam pumped longitudinal semiconductor laser, in accordance with one aspect of our invention, reduces significantly the problems of optical absorption in the unpumped portion of the active layer, provides for confinement of carriers to increase gain, and reduces nonradiative surface recombination. In an illustrative embodiment these desiderata are realized by interposing a thin buffer layer of semiconductor between the active layer and a first metal layer on which the e-beam is incident, by mutually adapting the thickness of the buffer layer and active layer with the energy of the e-beam so that the electron energy absorption peak falls within the active layer, and by bounding the active layer with a pair of wider bandgap semiconductor layers, one of which is the thin buffer layer, in order to confine minority carriers to the active layer. The second wider bandgap layer, termed a cavity-length-adjusting layer, is preferably made much thicker than the combined thickness of the buffer layer and active layer so as to provide a relatively long cavity. Thus, the length of the cavity can be adjusted to control diffraction losses and, importantly, spatial coherence. In this regard, the cavity resonator is illustratively defined by the first metal layer on the buffer layer and a second metal layer on the cavity-length-adjusting layer.

Accordingly, we have achieved low threshold, room temperature, pulsed operation in a CRT in which the target included, for example, a GaAs active layer separated from the e-beam source by a 0.5 $\mu$n thick Al$_{0.36}$Ga$_{0.64}$As buffer layer and bounded on the other side by a 13 $\mu$m thick Al$_{0.36}$Ga$_{0.64}$As cavity-length-adjusting layer. The e-beam was incident perpendicular to the layers, and the light beam ($\lambda = 0.88$ $\mu$m) direction was essentially parallel to the e-beam and hence was scannable. The e-beam energy was 34 keV, the spot size 130 $\mu$m, and the threshold current density was on the order of only 5 A/cm$^2$.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

Figure 1:
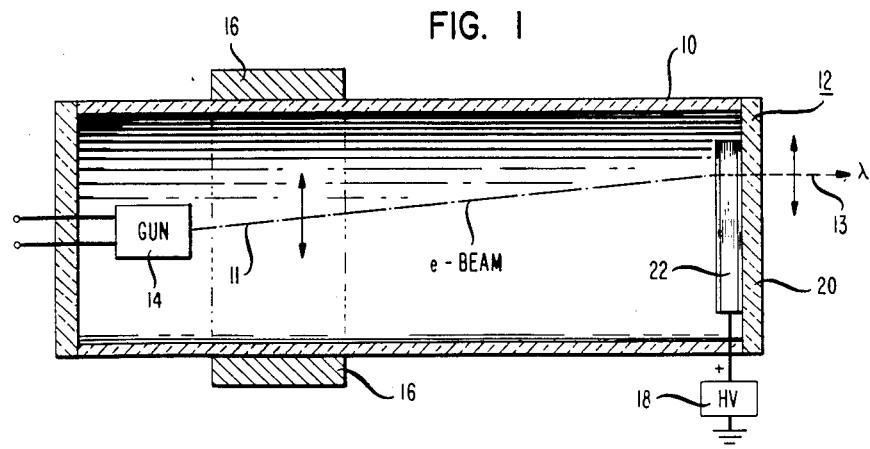
FIG. 1 is a schematic of a CRT semiconductor laser in accordance with one embodiment of our invention.

With reference now to FIG. 1, there is shown a CRT laser, in accordance with an illustrative embodiment of our invention, comprising an evacuable tube 10 having a target 12 mounted at one end and an electron gun 14 located near the other end. Electron beam focusing and deflection means 16, illustratively a magnetic arrangement, surrounds the tube 10 near the gun 14 so as to enable the electron beam 11 to be focused and scanned across the target 12. The target 12, which is maintained at a high positive potential by means of high voltage supply 18, comprises a transparent substrate 20, which is sealed to the end of tube 10, and a semiconductor structure 22 mounted on the interior surface of the substrate 20. The semiconductor structure 22 includes means forming a cavity resonator of the conventional Fabry-Perot geometry for sustaining stimulated emission of radiation. Illustratively, the cavity resonator is formed by a pair of metal layers 24 and 26 described in more detail hereinafter with reference to FIG. 2.

In operation, the high positive potential applied to the target causes the electron beam to be attracted to and absorbed in the semiconductor where it generates electron-hole pairs. When the electrons and holes recombine radiatively, they generate optical radiation which then causes stimulated emission with net gain in the resonator, thereby producing a light beam 13 which emanates essentially perpendicular to the target face. Since the e-beam makes a nearly 90° angle to the inside face of the target, the light beam and e-beam can be thought of as being essentially parallel—a common assumption for longitudinal lasers. The light beam 13 is scanned by scanning the electron beam 11.

Figure 2:
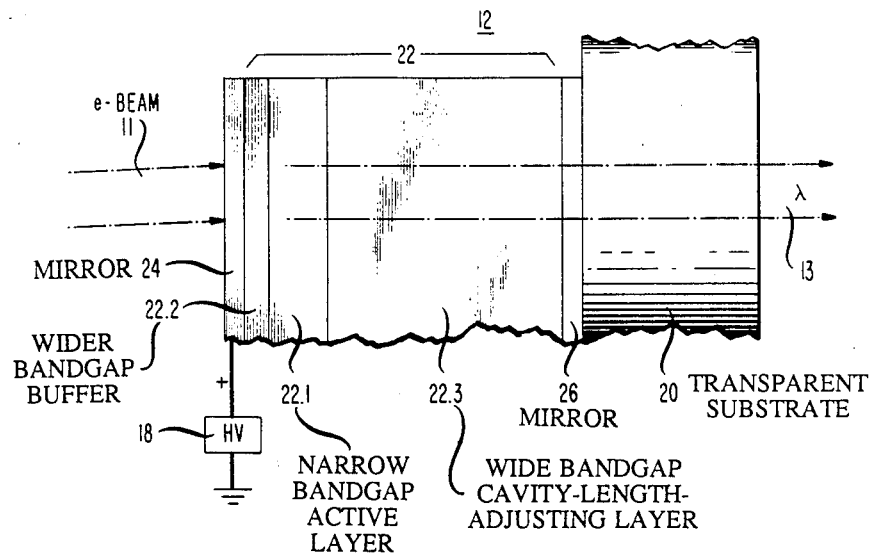
FIG. 2 is an enlarged view of a portion of the target of FIG. 1.

In accordance with a preferred embodiment of our invention, the target 12 shown in FIG. 2 includes the transparent substrate 20, the semiconductor structure 22, and the metal layers 24 and 26 located on the opposite major surfaces of structure 22 so as to form the mirrors of a cavity resonator. The metal layer 24 is made to be highly reflective at the optical radiation wavelength. The electron beam 11 is directly incident on layer 24 which serves to establish a uniform electrical potential surface and to establish precisely the e-beam landing energy. Thus, layer 24 is part of the electrical circuit comprising the high voltage supply 18, the cathode (in gun 14), the electron beam 11, and the anode (target 12). On the other hand, the metal layer 26, which is located between the semiconductor structure 22 and the transparent substrate 12, is made to be partially transmissive so as to permit egress of the light beam 13. This output mirror may also be of the multilayer dielectric type since it serves no electrical function.

Figure 3:
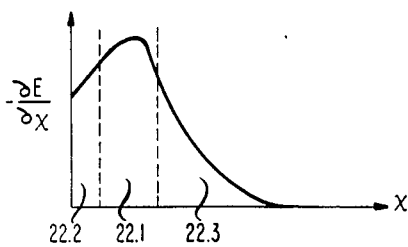
FIG. 3 is a graph showing schematically how the energy E of electrons is absorbed in the target of FIG. 2.

The semiconductor structure 22 comprises a relatively narrow bandgap, active layer 22.1 and a thin, wider bandgap, buffer layer 22.2 which is lattice-matched to the active layer 22.1 and separates the active layer from the metal layer 24. The thickness of the metal layer 24, the buffer layer 22.2 and the active layer 22.1 are mutually adapted with the electron beam energy so that the peak of the electron energy absorption occurs in the active layer 22.1 as shown in FIG. 3. For example, for a 34 keV electron beam energy, a metal layer 24 thickness of 700 Å, a buffer layer 22.2 thickness of 0.5–1.0 μm and active layer 22.1 thickness of 1.8–3.0 μm are suitable. Thus, the ratio of active-to-buffer layer thicknesses ranges from about 6:1 to 1.8:1.

On the other side of the active layer 22.1 is a second lattice-matched, wide bandgap, layer 22.3 which serves to adjust the length of the cavity resonator so as to control diffraction losses and spatial coherence. The single pass diffraction loss for the fundamental mode $\alpha_2 = 0.33 N^{-1.5}$ is defined by the Fresnel number N, given as a $n/\lambda L$, where a is the electron beam radius, n is the refractive index of the semiconductor structure, $\lambda$ is the wavelength of the optical radiation, and L is the length of the resonator (i.e., the thickness of the structure 22 between the mirrors 24 and 26). The cavity-length-adjusting layer 22.3 is much thicker than the buffer layer 22.2 and the active layer 22.1 taken together so that L is relatively large. A trade-off occurs for a given e-beam diameter. On the other hand, a large L implies a small N (~1) and larger diffraction losses, which introduce a larger loss differential between modes. This effect may be useful in achieving fundamental mode operation and hence a minimum size light spot at the output mirror. On the other hand, a smaller L implies a larger N (~8–10) and small diffraction losses (~1%) compared to the unavoidable losses (~5%) in the cavity (e.g., mirror losses, absorption losses, and scattering losses). Preferably, however, the diameter of the electron beam and the length of cavity-length-adjusting layer 22.3 are mutually adapted to limit laser oscillation to the lowest order (fundamental) mode of the Fabry-Perot resonator consistent with minimum diffraction loss.

In this regard, it should be noted that the portion of the active layer outside the e-beam is optically lossy so that the aperturing effect which occurs can be exploited to suppress high order modes and insure fundamental mode operation. That is, the single pass loss due to the aperturing effect is greater for small N and thus discriminates against higher order modes which have a larger mode diameter.

Cavity-length-adjusting layer 22.3 also provides structural integrity for the target and allows handling, processing, and mounting of the target with relative convenience. The thermal conductivity of the semiconductors making up target 22 are usually sufficiently high that the thickness of layer 22.3 is not thereby limited.

In addition to their respective buffer and cavity-length-adjustment functions, the layers 22.2 and 22.3, by virtue of their wider bandgap, also serve to confine carriers to the active layer 22.1, thereby increasing net optical gain. In this regard, the structure 22 preferably has a single conductivity type and preferably is lightly doped; i.e., the presence of a p-n junction might cause carriers to drift out of the active region, and high doping levels might cause unnecessary free-carrier absorption in layers 22.2 and 22.3 which are otherwise transparent by virtue of their high bandgap.

Illustratively, for operation at about 0.80–0.88 μm, the semiconductor structure 22 comprises an $Al_xGa_{1-x}As$ buffer layer, an $Al_yGa_{1-y}As$ active layer, and an $Al_zGa_{1-z}As$ cavity-length-adjusting layer, with y < x, z. The parameter y determines the operating wavelength. For example, for y = 0, $\lambda$ = 0.88 μm while for y = 0.08, $\lambda=0.82$ μm; y and z are typically 0.35. For operation at optical wavelengths of about 1.0–1.6 μm, the active layer typically comprises InGaAsP lattice-matched to InP buffer and cavity-length-adjusting layers.

A more detailed description of a CRT laser utilizing these materials is given below. In this example, however, materials, dimensions and other operating parameters are provided by way of illustration only, and, unless otherwise expressly stated, are not intended to limit the scope of the invention.

EXAMPLE I

In this example, the tube 10 was made of 1.5 inch O.D. glass, and the target 12 comprised a 0.5 μm thick n-$Al_{0.36}Ga_{0.64}As$ buffer layer 22.2 doped with Sn to about $5\times10^{16}$ cm$^{-3}$, a 3.0 μm thick n-GaAs active layer 22.1 doped with Sn to about $5\times10^{17}$ cm$^{-3}$, and a 13 μm thick n-$Al_{0.36}Ga_{0.64}As$ cavity-length-adjusting layer 22.3 doped with Sn to about $5\times10^{16}$ cm$^{-3}$. Thus, the active layer was 6 times thicker than the buffer layer, and the cavity-length-adjusting layer was about 4 times thicker than the buffer and active layers together.

Mirrors 24 and 26 comprised gold layers about 700 Å and 500 Å thick, respectively. Mirror 24 had about 97% reflectivity at the light beam wavelength of 0.85 μm, whereas the output mirror 26 had about 96% reflectivity and 1% transmittance. In an improved design, mirror 26 would comprise a stack of dielectric layers thereby providing a mirror with essentially no absorption loss and a transmittance which may be comparable to the total of the other internal losses. The substrate 20, which in general is a transparent material, comprised of 0.125 inch thick sapphire disk.

The target 12 was fabricated as follows: An N-GaAs substrate (i.e. a single crystal semiconductor body, not shown) with (100) orientation was obtained from commercial sources. Using standard liquid phase epitaxy (LPE) techniques, we grew the three layers 22.2, 22.1 and 22.3 epitaxially on the substrate in the order recited; i.e., the buffer layer was grown first and the cavity-length-adjusting layer last. Next, the partially transmitting gold mirror 26 was deposited on the cavity-length-adjusting layer 22.3, and then the wafer was epoxied, with mirror 26 down, to the sapphire disk 20. The GaAs substrate was then selectively etched away using a $H_2O_2$:$NH_4OH$ etchant, with the AlGaAs buffer layer 22.2 serving as a stop-etch layer. Following the deposition of gold mirror 24 on buffer layer 22.2, the target was mounted in a demountable chamber at the end of tube 10. Thus, gold mirror 24 faced the e-beam 11. The tube 10 was evacuated to about $10^{-7}$ Torr.

In operation, supply 18 was used to apply about 34 kV to the target 12, and a 700 μA e-beam 11, generated by a commercially available electron gun 14, was used to excite the active layer 22.1. The e-beam was pulsed at a repetition rate ranging from 1000 to 10,000 Hz with a pulse duration of 100 to 400 nsec. The cathode current was about 700 μA at threshold, and the beam spot size on the target was approximately 130 μm, corresponding to a beam current density of 5 A/cm$^2$.

Figure 4:
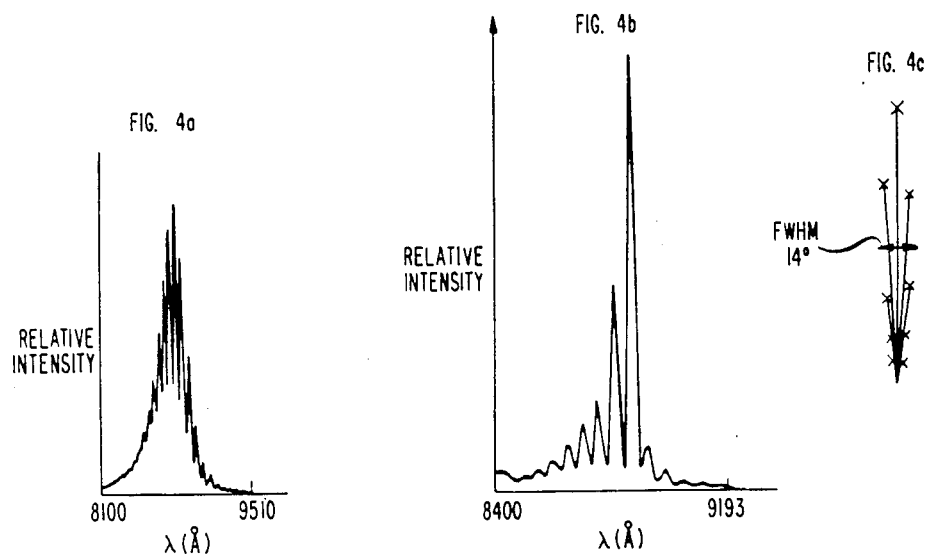
FIG. 4 shows the room temperature emission spectrum of a GaAs/AlGaAs laser of the type shown in FIG. 2; Part (a) shows the spectrum just below threshold; Part (b) shows the spectrum just above threshold; and Part (c) shows the angular divergence of the laser light beam.
Figure 5:
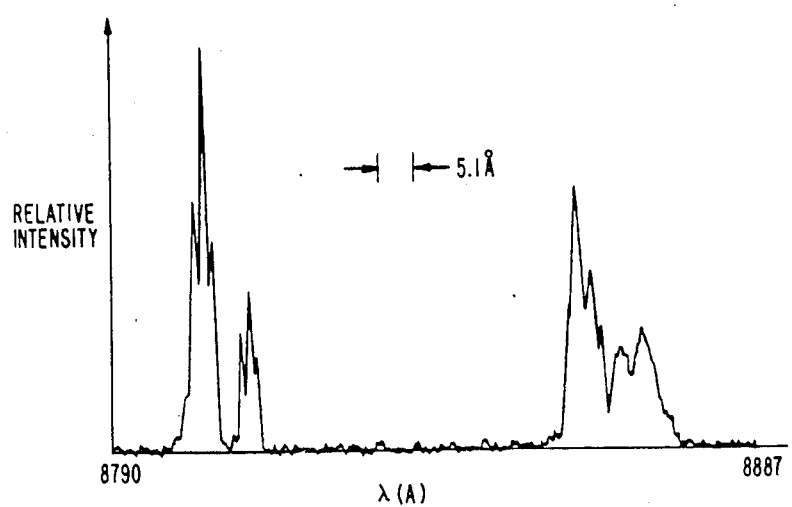
FIG. 5 shows a high resolution spectrum of two longitudinal modes for the laser of FIG. 2. The various spectral peaks correspond to spatial modes.

Emission spectra just under and just above threshold are shown in FIGS. 4(a) and 4(b), respectively, corresponding to light beam 13 having a wavelength of about 0.88 μm when lasing. A sharp increase in light beam power with increases in beam current density was observed. The angular divergence of the light beam shown in FIG. 4(c), was about 1420. FIG. 5 shows a high resolution spectrum centered on two longitudinal modes of the Fabry-Perot resonator geometry. Such a curve of output power versus wavelength would be expected to show two smooth curves with a Lorentzian profile. The structure is attributed to the presence of off-axis Fabry-Perot modes resulting from the very high Fresnel number of the particular geometry. We expect that the use of smaller beam diameter to lower the Fresnel number will lead to fundamental mode operation. This mode selection would be enhanced by the loss in the active layer outside the e-beam pumped region. The loss would serve as a mode selective aperture.

In this experiment, the peak output power was about 6 mW. With 24 W in the e-beam, this corresponds to an overall power conversion efficiency of $2.5\times10^{-4}$. We saw no signs of degradation despite operation with a stationary beam for many hours. Hence, we believe that the beam diameter can be reduced (e.g., to 25 μm) without significant risk. Increasing the e-beam current density by this means or by lowering the internal cavity loss by use of a multilayer dielectric mirror rather than a metal output mirror 26 would lead to significantly increased power and efficiency with attendant reduction in the beam divergence. For example, in another experiment utilizing such a dielectric output mirror, a 50–130 μm spot and an input power of 18 W, we observed a light beam power of 15 mW, corresponding to an efficiency of $8.4\times10^{-4}$.

EXAMPLE II

Using the same materials and compositions described in Example I, a similar target 12 was prepared but had a somewhat thicker buffer layer 22.2 and thinner active layer 22.1; i.e., the buffer layer 22.2 was 0.7 μm thick, the active layer was 1.8 μm thick, and the cavity-length-adjusting layer 22.3 was 13 m thick. Thus, the active layer was about 2.5 times thicker than the buffer layer, and the cavity-length-adjusting layer was about 5 times thicker than the buffer and active layers together. In general, however, the cavity-length-adjusting layer may range from, say, about 5–15 times thicker than the buffer and active layers taken together.

In operation, the supply 18 applied 36 kV to the target 12. The beam spot size was 90 μm, and the beam current was 300 μA. Again, lasing action was observed with the threshold at a current density of 5 A/cm$^2$, and smaller angular divergence corresponding to the reduced Fresnel number of the geometry.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although examples of our invention were described using the GaAs/AlGaAs materials, it is apparent to those skilled in the art that other lattice-matched materials, especially Group III–V compounds such as InP/InGaAsP and Group II–VI compounds, are also suitable. In addition, where the semiconductor substrate used for epitaxial growth is transparent at the light beam wavelength (e.g., InP at 1.0–1.6 μm), it may not be necessary to remove it after the structure 22 is grown. Rather, the transparent semiconductor substrate would be mounted on the tube 10, but the order of epitaxial growth would be reversed; i.e., the buffer and active layers would be grown on the substrate, and, after thinning and polishing the bottom of the substrate, the mirror 26 would be formed on the polished surface (thus, adjusting cavity length by adjusting substrate thickness).

What is claimed is:

1. A method of fabricating a target for an electron-beam-pumped semiconductor laser, comprising the steps of:

providing a single crystal semiconductor body, epitaxially growing on the body a plurality of layers including: a thin, buffer layer of a relatively wide bandgap semiconductor on the body; a thicker, narrower bandgap active layer on the buffer layer; and a much thicker, wider bandgap cavity-length-adjusting layer on the active layer, forming on the cavity-length-adjusting layer a first mirror which is partially transmissive at the optical wavelength of the laser, affixing a transparent substrate to the first mirror, removing the single crystal substrate to expose the buffer layer, and forming on the buffer layer a second mirror, including a metal layer, which is highly reflecting at the optical wavelength.

2. The method of claim 1 wherein said body comprises GaAs and said growing step comprises epitaxially growing $Al_xGa_{1-x}As$ buffer layer, an $Al_yGa_{1-y}As$ active layer, and an $Al_zGa_{1-z}As$ adjusting layer so that $y<x$, $z$ and each of said layers has the same conductivity type.

3. The method of claim 2 wherein said substrate comprises sapphire.

* * * * *